United States Patent
Lower et al.

(10) Patent No.: US 8,174,830 B2
(45) Date of Patent: May 8, 2012

(54) SYSTEM AND METHOD FOR A SUBSTRATE WITH INTERNAL PUMPED LIQUID METAL FOR THERMAL SPREADING AND COOLING

(75) Inventors: Nathan P. Lower, North Liberty, IA (US); Ross K. Wilcoxon, Cedar Rapids, IA (US); Qizhou Yao, Coralville, IA (US); David W. Dlouhy, Cedar Rapids, IA (US); John A. Chihak, Hiawatha, IA (US)

(73) Assignee: Rockwell Collins, Inc., Cedar Rapis, IA (US)

( * ) Notice: Subject to any disclaimer, the term of this patent is extended or adjusted under 35 U.S.C. 154(b) by 103 days.

(21) Appl. No.: 12/116,126

(22) Filed: May 6, 2008

(65) Prior Publication Data

US 2009/0279257 A1    Nov. 12, 2009

(51) Int. Cl.
*H05K 7/20* (2006.01)
*F28F 7/00* (2006.01)
*H01L 23/34* (2006.01)

(52) U.S. Cl. ...... 361/699; 361/720; 165/80.4; 165/80.5; 165/104.33; 174/15.1; 174/252; 257/714

(58) Field of Classification Search .......... 361/699, 361/720, 721; 165/80.4, 80.5, 104.33; 174/15.1; 257/714; 62/3.2, 3.7, 259.2
See application file for complete search history.

(56) References Cited

U.S. PATENT DOCUMENTS

| | | |
|---|---|---|
| 3,508,974 A | 4/1970 | Bressler |
| 3,654,528 A | 4/1972 | Barkan |
| 3,723,790 A | 3/1973 | Dumbaugh et al. |
| 3,812,404 A | 5/1974 | Barkan et al. |
| 4,177,015 A | 12/1979 | Davidson |
| 4,294,658 A | 10/1981 | Humphreys et al. |
| 4,410,874 A | 10/1983 | Scapple et al. |
| 4,505,644 A | 3/1985 | Meisner et al. |
| 4,560,084 A | 12/1985 | Wolfson |
| 4,572,924 A | 2/1986 | Wakely et al. |
| 4,622,433 A | 11/1986 | Frampton |
| 4,761,518 A | 8/1988 | Butt et al. |
| 4,765,948 A | 8/1988 | DeLuca et al. |
| 4,773,826 A | 9/1988 | Mole |
| 4,802,531 A | 2/1989 | Nathenson et al. |

(Continued)

FOREIGN PATENT DOCUMENTS

JP    60-013875    1/1985

(Continued)

OTHER PUBLICATIONS

U.S. Appl. No. 12/284,670, filed Sep. 24, 2008, Cripe et al.

(Continued)

*Primary Examiner* — Zachary M Pape
(74) *Attorney, Agent, or Firm* — Donna P. Suchy; Daniel M. Barbieri

(57) ABSTRACT

A circuit board includes a pump and a channel. The channel includes a liquid metal and a coating. The liquid metal is pumped through the channel by the pump and the coating reduces diffusion and chemical reaction between the liquid metal and at least portions of the channel. The liquid metal can carry thermal energy to act as a heat transfer mechanism between two or more locations on the substrate. The substrate may include electrical interconnects to allow electrical components to be populated onto the substrate to form an electronics assembly.

18 Claims, 5 Drawing Sheets

U.S. PATENT DOCUMENTS

| | | | |
|---|---|---|---|
| 4,882,212 A | 11/1989 | SinghDeo et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Solc et al. | |
| 5,244,726 A | 9/1993 | Laney et al. | |
| 5,265,136 A | 11/1993 | Yamazaki et al. | |
| 5,315,155 A | 5/1994 | O'Donnelly et al. | |
| 5,502,889 A | 4/1996 | Casson et al. | |
| 5,686,703 A | 11/1997 | Yamaguchi | |
| 5,702,963 A | 12/1997 | Vu et al. | |
| 5,863,605 A | 1/1999 | Bak-Boychuk et al. | |
| 5,916,944 A | 6/1999 | Camilletti et al. | |
| 5,958,794 A | 9/1999 | Bruxvoort et al. | |
| 5,965,947 A | 10/1999 | Nam et al. | |
| 5,991,351 A | 11/1999 | Woolley | |
| 6,010,956 A | 1/2000 | Takiguchi et al. | |
| 6,019,165 A | 2/2000 | Batchelder | |
| 6,021,844 A | 2/2000 | Batchelder | |
| 6,027,791 A | 2/2000 | Higashi et al. | |
| 6,028,619 A | 2/2000 | Saita et al. | |
| 6,039,896 A | 3/2000 | Miyamoto et al. | |
| 6,048,656 A | 4/2000 | Akram et al. | |
| 6,087,018 A | 7/2000 | Uchiyama | |
| 6,110,656 A | 8/2000 | Eichorst et al. | |
| 6,121,175 A | 9/2000 | Drescher et al. | |
| 6,124,224 A | 9/2000 | Sridharan et al. | |
| 6,159,910 A | 12/2000 | Shimizu et al. | |
| 6,356,334 B1 | 3/2002 | Mathew et al. | |
| 6,423,415 B1 | 7/2002 | Greene et al. | |
| 6,451,283 B1 | 9/2002 | Kuznicki et al. | |
| 6,486,087 B1 | 11/2002 | Saling et al. | |
| 6,586,087 B2 | 7/2003 | Young | |
| 6,599,643 B2 | 7/2003 | Heimann et al. | |
| 6,658,861 B1 | 12/2003 | Ghoshal et al. | |
| 6,708,501 B1 | 3/2004 | Ghoshal et al. | |
| 6,798,072 B2 | 9/2004 | Kajiwara et al. | |
| 6,800,326 B1 | 10/2004 | Uchiyama | |
| 6,918,984 B2 | 7/2005 | Murray et al. | |
| 7,045,905 B2 | 5/2006 | Nakashima | |
| 7,078,263 B2 | 7/2006 | Dean | |
| 7,131,286 B2 | 11/2006 | Ghoshal et al. | |
| 7,176,564 B2 | 2/2007 | Kim | |
| 7,293,416 B2 | 11/2007 | Ghoshal | |
| 7,296,417 B2 | 11/2007 | Ghoshal | |
| 7,297,206 B2 | 11/2007 | Naruse et al. | |
| 7,340,904 B2 | 3/2008 | Sauciuc et al. | |
| 7,342,787 B1 | 3/2008 | Bhatia | |
| 7,348,665 B2 | 3/2008 | Sauciuc et al. | |
| 7,391,060 B2 | 6/2008 | Oshio | |
| 7,491,431 B2 | 2/2009 | Chiruvolu et al. | |
| 7,692,259 B2 | 4/2010 | Suehiro | |
| 7,737,356 B2 | 6/2010 | Goldstein | |
| 2001/0015443 A1 | 8/2001 | Komoto | |
| 2002/0000630 A1 | 1/2002 | Coyle | |
| 2002/0054976 A1 | 5/2002 | Nakamura et al. | |
| 2002/0078856 A1 | 6/2002 | Hahn et al. | |
| 2002/0086115 A1 | 7/2002 | Lamers et al. | |
| 2002/0170173 A1 | 11/2002 | Mashino | |
| 2002/0189495 A1 | 12/2002 | Hayashi et al. | |
| 2002/0189894 A1 | 12/2002 | Davis et al. | |
| 2003/0047735 A1 | 3/2003 | Kyoda et al. | |
| 2003/0080341 A1 | 5/2003 | Sakano et al. | |
| 2003/0218258 A1 | 11/2003 | Charles et al. | |
| 2003/0228424 A1 | 12/2003 | Dove et al. | |
| 2004/0106037 A1 | 6/2004 | Cho et al. | |
| 2004/0116577 A1 | 6/2004 | Naruse et al. | |
| 2004/0156995 A1 | 8/2004 | Komiyama et al. | |
| 2004/0194667 A1 | 10/2004 | Reuscher | |
| 2005/0003947 A1 | 1/2005 | Mazany et al. | |
| 2005/0082691 A1 | 4/2005 | Ito et al. | |
| 2005/0123684 A1 | 6/2005 | Makowski et al. | |
| 2005/0179742 A1 | 8/2005 | Keenan et al. | |
| 2006/0045755 A1 | 3/2006 | McDonald et al. | |
| 2006/0068218 A1 | 3/2006 | Hooghan et al. | |
| 2006/0095677 A1 | 5/2006 | Hakura et al. | |
| 2006/0113066 A1* | 6/2006 | Mongia et al. | 165/104.33 |
| 2006/0135342 A1 | 6/2006 | Anderson et al. | |
| 2006/0158849 A1* | 7/2006 | Martin et al. | 361/699 |
| 2006/0250731 A1 | 11/2006 | Parkhurst et al. | |
| 2006/0268525 A1* | 11/2006 | Jeong | 361/719 |
| 2006/0283546 A1 | 12/2006 | Tremel et al. | |
| 2007/0075323 A1 | 4/2007 | Kanazawa et al. | |
| 2007/0102833 A1 | 5/2007 | Hack et al. | |
| 2007/0224400 A1 | 9/2007 | Meguro et al. | |
| 2008/0006204 A1 | 1/2008 | Rusinko et al. | |
| 2008/0050512 A1 | 2/2008 | Lower et al. | |
| 2008/0063875 A1 | 3/2008 | Robinson et al. | |
| 2008/0142966 A1 | 6/2008 | Hirano et al. | |
| 2009/0246355 A9 | 10/2009 | Lower et al. | |

FOREIGN PATENT DOCUMENTS

| | | |
|---|---|---|
| JP | 57-027942 | 2/1985 |
| JP | 2006-045420 | 2/2006 |
| WO | WO-2006/095677 | 9/2006 |

OTHER PUBLICATIONS

U.S. Appl. No. 12/283,563, filed Sep. 12, 2008, Lower et al.
U.S. Appl. No. 12/283,504, filed Sep. 12, 2008, Lower et al.
U.S. Appl. No. 12,283,502, filed Sep. 12, 2008, Wilcoxon et al.
U.S. Appl. No. 12/283,501, filed Sep. 12, 2008, Wilcoxon et al.
U.S. Appl. No. 11/784,158, filed Apr. 5, 2007, Lower et al.
U.S. Appl. No.11/508,782, filed Aug. 23, 2006, Lower et al.
Non-Final Office Action for U.S. Appl. No. 11/784,932, dated Apr. 3, 2009, 8 pages.
Non-Final Office Action for U.S. Appl. No. 11/784,158, dated Apr. 21, 2009, 10 pages.
Final Office Action for U.S. Appl. No. 11/508,782, dated Jun. 16, 2009, 13 pages.
U.S. Appl. No. 11/959,225, filed Dec. 18, 2007, Lower et al.
U.S. Appl. No.11/732,982, filed Apr. 5, 2007, Boone et al.
U.S. Appl. No. 11/732,981, filed Apr. 5, 2007, Wilcoxon et al.
U.S. Appl. No. 11/508,782, filed Aug. 23, 2006, Lower et al.
"Bonding and Coating Applications of PQ® Soluble Silicates," Bulletin 12-31, PQ Corporation, 2003, 7 pages.
"PQ® Soluble Silicates in Refractory and Chemical-Resistant Cements," Bulletin 24-1, PQ Corporation, 2003, 6 pages.
Click et al., "SCHOTT Low Temperature Bonding for Precision Optics," website: http://optics.nasa.gov/tech_days/tech_days_2004/docs/18%20Aug%202004/23%20Schott%20Low%20Temperature%20Bonding.pdf, 20 pages.
Technical Standard Order, TSO-C115b, Airborne Area Navigation Equipment Using Multi-Sensor Inputs, Sep. 30, 1994, 11 pages, Department of Transportation, Federal Aviation Administration, Washington, DC.
Techpowerup, "NanoCoolers puts liquid metal in your PC," website: http://www.techpowerup.com/?3105, May 4, 2005, 19 pages.
Thresh, John C., "The Action of Natural Waters on Lead," The Analyst, Proceedings of the Society of Public Analysts and Other Analytical Chemists, vol. XLVII, No. 560, Nov. 1922, pp. 459-468.
Office Action for U.S. Appl. No. 11/784,158, mail date Oct. 8, 2009, 7 pages.
Office Action for U.S. Appl. No. 11/784,932, mail date Feb. 16, 2010, 11 pages.
Office Action for U.S. Appl. No. 11/784,158, mail date Mar. 26, 2010, 7 pages.
Office Action for U.S. Appl. No. 11/784,158, mail date Jun. 17, 2010, 7 pages.
Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.
International Search Report and Written Opinion for International Application No. PCT/US2008/074224, mail date Jan. 30, 2009, 10 pages.
International Search Report and Written Opinion for International Application No. PCT/US2008/075591, mail date Apr. 8, 2009, 7 pages.

Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.

Mysen, B. et al. Silicate Glasses and Melts, vol. 10: Properties and Structure (Developments in Geochemistry) (Book Description), website: http://www.amazon.com/Silicate-Glasses-Melts-Developments-Geochemistry/dp/0444520112, 4 pgs.

Nascimento, M. L. F., et al. Universal curve of ionic conductivities in binary alkali silicate glasses, Journal of Materials Science (2005), Springer Science+Business Media, Inc., website: http://www.springerlink.com/content/p7535075x1872016/, 3 pgs.

Notice of Allowance for U.S. Appl. No. 11/784,158, mail date Nov. 29, 2010, 8 pages.

Office Action for U.S. Appl. No. 11/508,782, mail date Sep. 2, 2010, 14 pages.

Office Action for U.S. Appl. No. 12/284,670, mail date Sep. 28, 2010, 11 pages.

Office Action for U.S. Appl. No. 11/732,981, mail date Oct. 6, 2010, 10 pages.

Office Action for U.S. Appl. No. 11/959,225, mail date Oct. 27, 2010, 12 pages.

Office Action for U.S. Appl. No. 11/784,932, mail date Nov. 10, 2010, 10 pages.

Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract Only) website: http://pubs.acs.org/doi/abs/10.1021/cm062619r, 2 pgs.

Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.

The Mixed—Alkali Effect for the Viscosity of Glasses, printed on Dec. 3, 2010 from website: http://glassproperties.com/viscosity/mixed-alkali-effect-viscosity/, 7 pages.

The Structure of Glasses. Alkali silicate glasses, printed on Dec. 3, 2010 from website: http://www.ptc.tugraz.at/specmag/struct/ss.htm, 1 page.

Notice of Allowance for U.S. Appl. No. 12/284,670, mail date May 11, 2011, 7 pages.

Notice of Allowance for U.S. Appl. No. 11/784,932, mail date May 12, 2011, 11 pages.

Notice of Allowance for U.S. Appl. No. 11/508,782, mail date May 31, 2011, 9 pages.

Notice of Allowance for U.S. Appl. No. 12/286,207, mail date Jun. 27, 2011, 12 pages.

Office Action for U.S. Appl. No. 12/286,207, mail date Dec. 27, 2010, 15 pages.

Office Action for U.S. Appl. No. 11/508,782, mail date Jan. 19, 2011, 10 pages.

Office Action for U.S. Appl. No. 11/732,982, mail date Feb. 2, 2011, 16 pages.

Office Action for U.S. Appl. No. 11/732,981, mail date Mar. 16, 2011, 7 pages.

Office Action for U.S. Appl. No. 12/240,775, mail date May 26, 2011, 10 pages.

Office Action for U.S. Appl. No. 11/732,982, mail date Jun. 21, 2011, 15 pages.

* cited by examiner

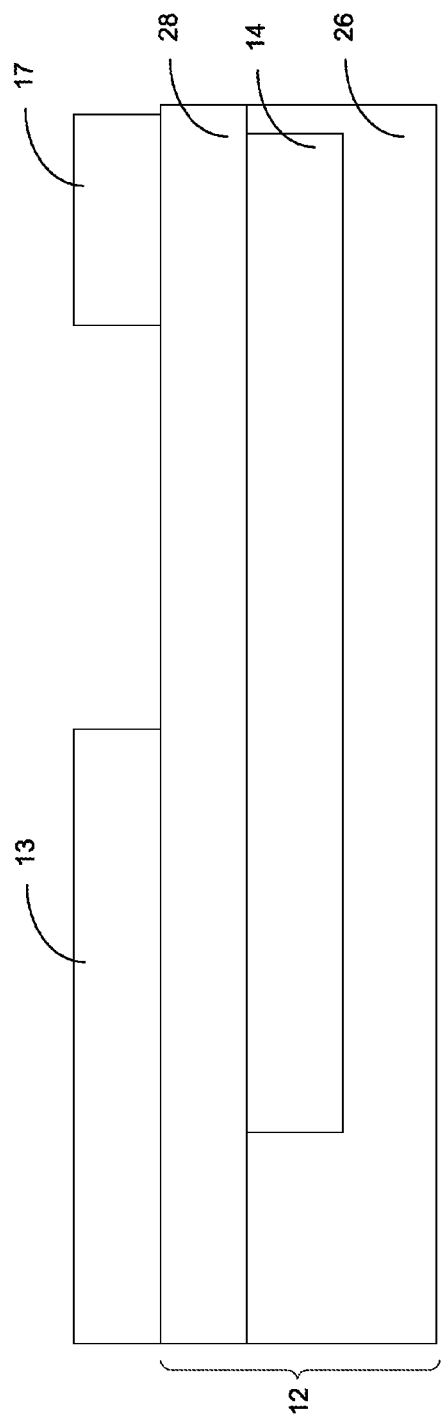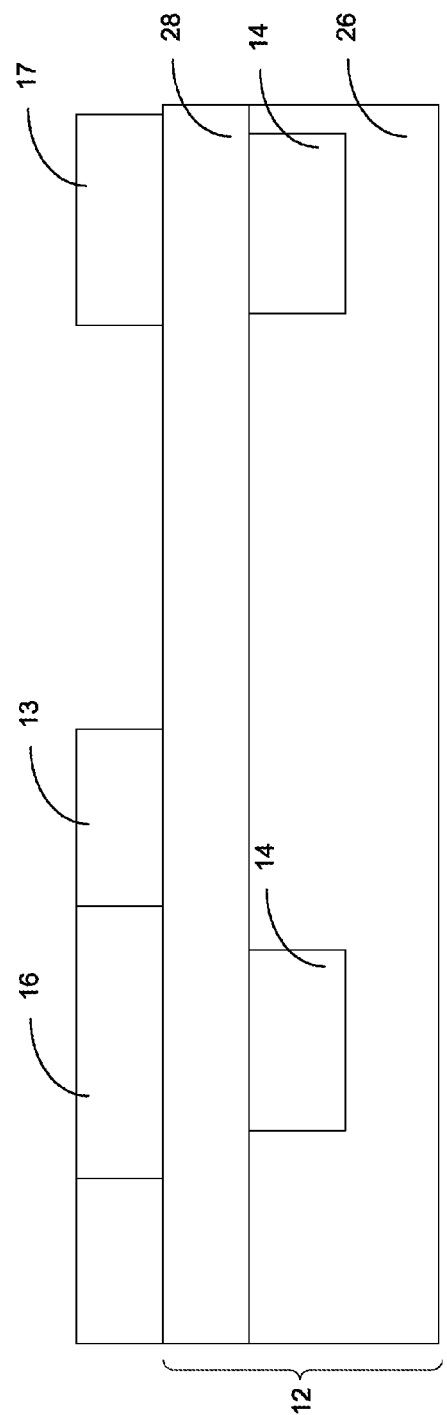

SYSTEM AND METHOD FOR A SUBSTRATE WITH INTERNAL PUMPED LIQUID METAL FOR THERMAL SPREADING AND COOLING

BACKGROUND

The present application relates generally to the field of cooling electronics. More specifically, the application relates to cooling of power dissipating devices, such as electronics, using liquid metal.

There is a growing demand to make electronic devices smaller and to operate at higher power. In some applications, including computers, peak power densities are reaching 400-500 W/cm$^2$ and climbing. As a result, it is becoming increasingly more difficult to thermally manage these devices. Increasing temperatures often lead to decreased efficiency and reliability.

Conventional thermal management techniques such as forced air cooling, liquid cooling, spray cooling, and thermoelectric cooling may adequately cool the electronic device in some cases, but these techniques can be complicated, unreliable, orientation sensitive, or unsuitable for volume-constrained systems. The use of passive heat spreading materials and heat pipes may also adequately cool the electronic device, but increasing thermal path length and high device power can render these techniques insufficient. Conventional techniques may no longer provide adequate cooling for advanced high power electronic systems.

Thus there is a need for a low cost cooling system for power dissipating systems, such as high power electronic systems. Further, there is a need for a simple and reliable cooling system that does not add significant cost and power requirements. Further still, there is a need for an integrated thermal management technique for spreading heat from a circuit board. Yet further, there is a need for a thermal management system for portable applications, including military applications, that are smaller in size and weight.

SUMMARY

One embodiment of the application relates to a circuit board including a pump and a channel. The channel includes a liquid metal and a coating. The liquid metal is pumped through the channel by the pump and the coating reduces diffusion (or alloying) between the liquid metal and at least portions of the channel.

Another embodiment of the application relates to a circuit board including one or more electrodes, one or more magnets, and a channel. The channel includes a liquid metal and a coating. The liquid metal is pumped through the channel by an electromagnetic force generated by the one or more electrodes and one or more magnets and the coating reduces diffusion or alloying between the liquid metal and metallic components in the channel.

Another embodiment of the application relates to a circuit board including channel means for containing a liquid metal, pump means for pumping the liquid metal through the channel means, and coating means for reducing diffusion between the liquid metal and other components in the channel.

BRIEF DESCRIPTION OF THE DRAWINGS

The disclosure will become more fully understood from the following detailed description, taken in conjunction with the accompanying drawings, wherein like reference numerals refer to like elements, in which:

FIG. 6 is a side cross section view through a portion of the thermal management system of FIG. 1 according to an exemplary embodiment.

FIG. 7 is a side cross section view through another portion of the thermal management system of FIG. 1 according to an exemplary embodiment.

DETAILED DESCRIPTION OF THE EXEMPLARY EMBODIMENTS

Figure 1:
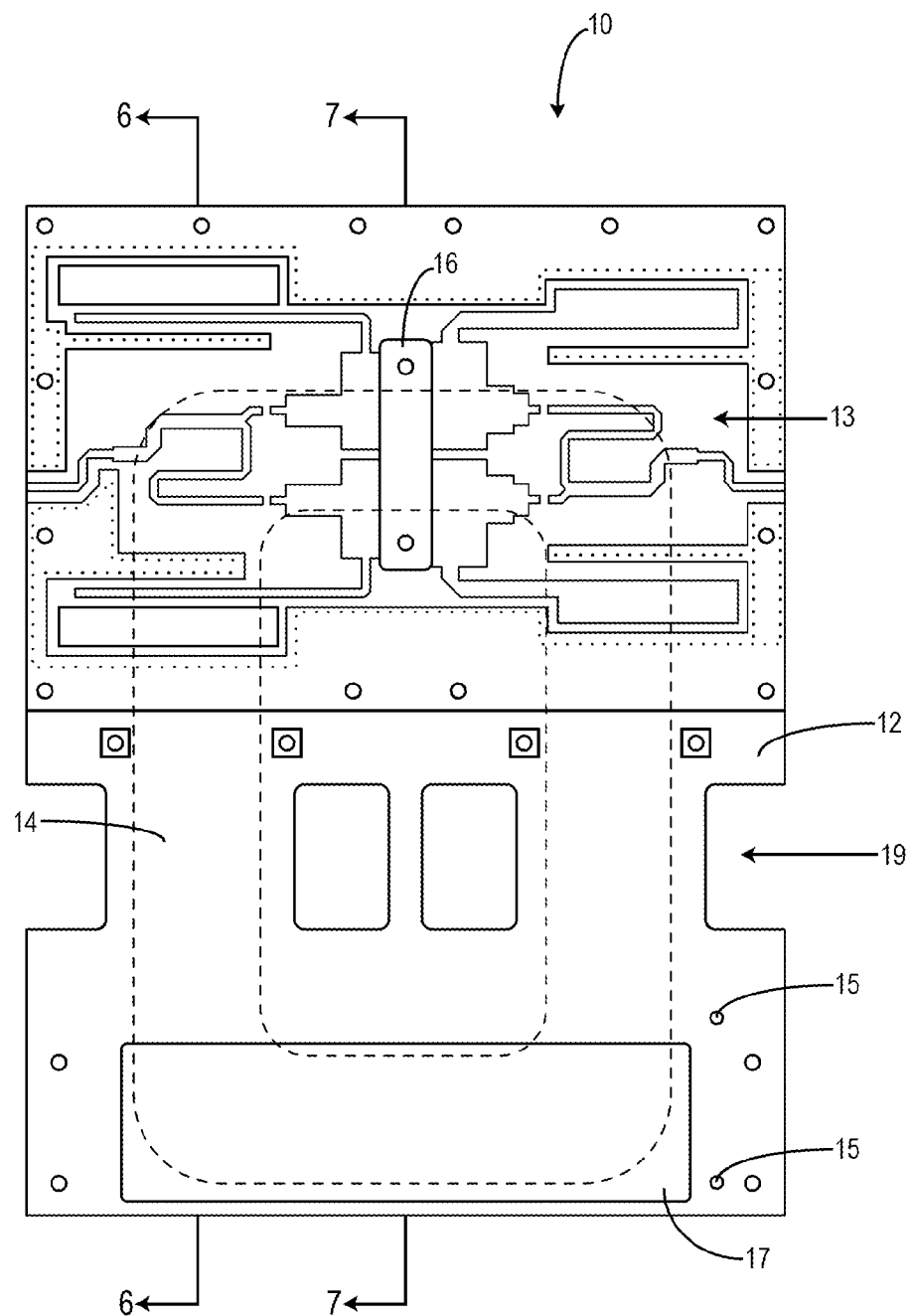
FIG. 1 is an overhead schematic view of a circuit board with an integrated thermal management system according to an exemplary embodiment.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components software, and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Figure 2:
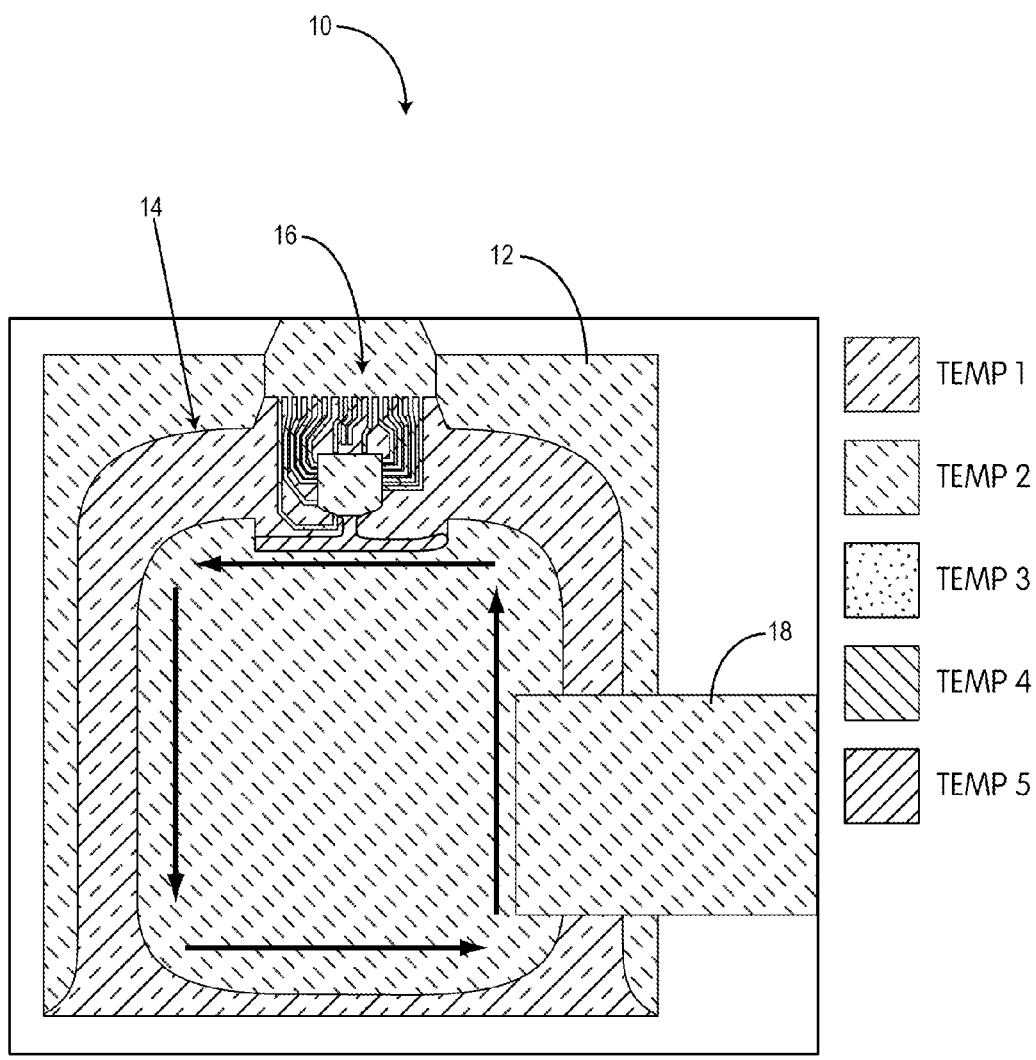
FIG. 2 is a thermal imaging schematic view of a thermal management system similar to that of FIG. 1 according to an exemplary embodiment.
Figure 3:
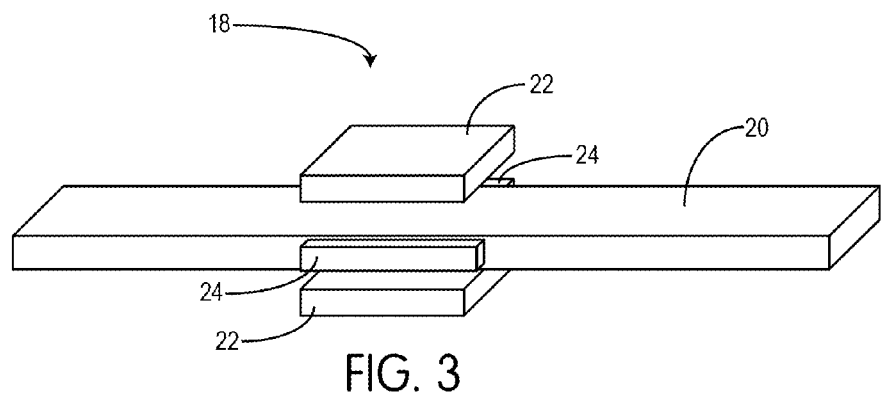
FIG. 3 is a perspective view of an electromagnetic pump for pumping liquid metal in the thermal management system of FIG. 1 according to an exemplary embodiment.

Referring to FIGS. 1 and 2, according to an exemplary embodiment, a thermal management system 10 may provide significant improvement in the thermal spreading capability of a substrate 12 including circuitry 13 as compared to passive materials and composites. Thermal management system 10 includes a closed-loop liquid metal channel 14 in substrate 12 containing a device 16 to be cooled. According to various exemplary embodiments, the substrate may be a printed circuit board, a thermal spreader (which may be rigid or mechanically flexible), or any other substrate to which at least one power dissipating device, such as an electronic component, is attached or interfaces. According to various exemplary embodiments, the device may be a high power electronic circuit (e.g., a rectifier, an inverter, another power semiconductor device, etc.), a microprocessor, and/or any other analog or digital circuit that generates heat.

The liquid metal is circulated through channel 14 using a magnetic or electromagnetic (EM) pump 18. Pump 18 may be inserted into or attached to the substrate at a feed-through or cavity 19. As the liquid metal flows, it draws heat away from device 16 and spreads the heat throughout substrate 12 and/or carries the heat to a heat sink that is in contact with a heat rejection area on substrate 12. By transferring heat away from device 16, the thermal transfer can be significantly improved over conventional passive thermal spreading materials, including copper. Because the liquid metal cooling is single phase (no phase change occurs), thermal management system 10 may not be restrained by the heat flux limits of two phase systems such as heat pipes. While the liquid metal is shown by arrows to flow in a particular direction, according to other exemplary embodiments, the thermal management system could be configured for the liquid metal to flow in the other direction. Liquid metal channel 14 may be filled with liquid metal using ports 15. Heat sink 17 may be a copper plate, another metal plate, may include cooling fins, or may be any other device capable of promoting heat exchange. Circuitry 13 may be high or low power electronic circuits and may also be cooled using channel 14.

Referring specifically to FIG. 2, as an example, the liquid metal generally flows through channel 14 at a first or lowest temperature (e.g., between 15 and 25 degrees Celsius (C), between 18 and 22 degrees C., between 20 and 21 degrees C., at about 20 or 21 degrees C., etc.) in thermal management system 10. A substantial portion of substrate 12 and at least a portion of device 16 is at a second temperature that is higher than the first temperature (e.g., between 20 and 24 degrees C., between 21 and 23 degrees C., at about 22 degrees C., below 20 degrees C., etc.). A portion of device 16 may be at a third temperature that is higher than the second temperature (e.g., between 22 and 26 degrees C., between 23 and 25 degrees C., at about 24 degrees C., etc.). A portion of device 16 may be at a fourth temperature that is higher than the third temperature (e.g., between 23 and 27 degrees C., between 24 and 26 degrees C., at about 25 degrees C., etc.). A portion of device 16 may be at a fifth temperature that is higher than the fourth temperature (e.g., between 25 and 30 degrees C., between 26 and 29 degrees C., at about 28 degrees C., above 30 degrees C., etc.). It is noted that while FIG. 2 illustrates a single heat dissipating component, according to other exemplary embodiments, the substrate may absorb dissipated heat from more than one component.

According to various exemplary embodiments, the liquid metal may be an alloy, such as a Gallium-Indium-Tin alloy. According to other exemplary embodiments, alternative liquid metals may be used, including alloys containing any combination of the following: gallium, indium, tin, bismuth, lead, sodium, and potassium. According to some exemplary embodiments, the Gallium-Indium-Tin alloy may be a eutectic composition (e.g. the lowest melting point within the compositional series) with a low boiling point. According to some exemplary embodiments, the Gallium-Indium-Tin alloy may be Galinstan®. Galinstan® is a generally non-flammable, non-toxic, environmentally friendly liquid metal that is often used as a mercury replacement in medical equipment. Galinstan® is generally stable from −19 degrees C. to greater than 1300 degrees C., has approximately thirty times the thermal conductivity of water, and is insoluble to water and organic solvents. The high boiling point of Galinstan® (greater than 1300 degrees C.) ensures that it will remain in a liquid state under temperatures and pressures likely to be encountered in electronics cooling.

Referring to FIG. 2, pump 18 may be an electromagnetic pump to circulate a liquid metal 20 through thermal management system 10. An electromagnetic pump may provide quiet or silent operation, high reliability, orientation independence, little to no vibration, low power dissipation, and a controllable flow rate for adjustment of thermal spreading capability. Pump 18 may include a ferrous yoke for containing and directing the magnetic field within the yoke and through liquid metal channel 14 between north and south poles of magnets 22. A pair of electrodes 24 transmit a current across liquid metal 20 in a direction perpendicular to the magnetic field generated by magnets 22. The travel of the current across the magnetic field generates a force in the liquid metal that is perpendicular to both the magnetic field and the current. The amount of force generated follows the following equation:

$$F = I * L \times B \tag{1}$$

Where I is current (in amps), L is a vector, whose magnitude is the length of the current path (in meters), X is the vector cross product, and B is the magnetic field vector measured in Teslas.

The magnitude of force is represented by the variable F, the magnitude of the magnetic field is represented by the variable B, the amount of current is represented by the variable I, and the electrode spacing is represented by the variable L. The pressure of the liquid metal flow can be calculated with the following equation:

$$P = \frac{F}{L \times h} \tag{2}$$

The pressure is represented by the variable P, the force by the variable F, the electrode spacing by the variable L, and the height of liquid metal channel 14 by the variable h.

Pump 18 can be made to occupy a small volume (e.g., approximately one cubic centimeter, less than one cubic centimeter, less than 10 cubic centimeters, greater than 1 cubic centimeter, etc.) and can pump liquid metal with electrical power of less than 10 mW, less than 100 mW, less than 500 mW, etc. The pump may not use any moving parts, may require little to no maintenance, may be orientation independent, and may be generally stable at air pressures down to 10-8 Torr at 500 degrees Celsius. According to various exemplary embodiments, one or both of magnets 22 may be permanent magnets and/or electromagnets including coils to induce a magnetic field. While two electrodes are shown, according to other exemplary embodiments, the current may be generated by a single electrode and flowing to a sink or ground, or more than two electrodes could be used. While two magnets are shown, according to other exemplary embodiments a single magnet with a pole extending over opposite sides of channel 14, or more than two magnets could be used. According to various exemplary embodiments, pump 18 may operate at less than about 1 W, between about 100 mW and about 500 mW, less than 500 mw, less than 100 mw, etc. Pump 18 may be coupled to a processor, a user interface, or other digital or analog circuitry to control electric current flow and thereby adjust the pump flow.

A coating can be applied to the inner and/or outer perimeter of the liquid metal channel to provide a low cost passivation within the channel. According to some exemplary embodiments, the coating may reduce alloying, diffusion, or chemical reaction between components in the channel (e.g., metallic components) and the alloy. The coating may provide at least a substantially hermetic seal around the liquid metal to separate it from the substrate itself and/or the substrate circuitry. According to various exemplary embodiments, the coating may be a thermally conductive coating capable of minimizing the thermal resistance between the liquid metal and the substrate or circuitry. The coating may be composed of any material or materials capable of passivating the liquid metal from the circuitry or substrate, capable of promoting thermal conductivity between the liquid metal and the substrate or circuitry, and/or capable of being applied to the channel of the substrate. According to some exemplary embodiments, the coating may only be applied to metallic portions of the channel that are in contact with the liquid metal.

According to other exemplary embodiments, the coating may be a coating described in U.S. patent application Ser. No. 11/508,782 filed on Aug. 23, 2006 and entitled "Integrated Circuit Protection and Ruggedization Coatings and Methods," U.S. patent application Ser. No. 11/784,158 filed on Apr. 5, 2007 and entitled "Hermetic Seal and Hermetic Connector Reinforcement and Repair with Low temperature Glass Coatings," U.S. patent application Ser. No. 11/732,982 filed on Apr. 5, 2007 and entitled "A Method for Providing Near-Hermetically Coated Integrated Circuit Assemblies," U.S. patent application Ser. No. 11/732,981 filed on Apr. 5, 2007 and entitled "A Method for Providing Near-Hermetically Coated, Thermally Protected Integrated Circuit Assemblies," U.S. patent application Ser. No. 11/784,932 filed on Apr. 10, 2007 and entitled "Integrated Circuit Tampering Protection and Reverse Engineering Prevention Coatings and Methods," and/or U.S. patent application Ser. No. 11/959,225 filed on Dec. 18, 2007 and entitled "Adhesive Applications Using Alkali Silicate Glass for Electronics," each of which is herein incorporated by reference in its entirety.

According to other exemplary embodiments, the coating may be applied as described in U.S. patent application Ser. No. 11/508,782 filed on Aug. 23, 2006 and entitled "Integrated Circuit Protection and Ruggedization Coatings and Methods," U.S. patent application Ser. No. 11/784,158 filed on Apr. 5, 2007 and entitled "Hermetic Seal and Hermetic Connector Reinforcement and Repair with Low temperature Glass Coatings," U.S. patent application Ser. No. 11/732,982 filed on Apr. 5, 2007 and entitled "A Method for Providing Near-Hermetically Coated Integrated Circuit Assemblies," U.S. patent application Ser. No. 11/732,981 filed on Apr. 5, 2007 and entitled "A Method for Providing Near-Hermetically Coated, Thermally Protected Integrated Circuit Assemblies," U.S. patent application Ser. No. 11/784,932 filed on Apr. 10, 2007 and entitled "Integrated Circuit Tampering Protection and Reverse Engineering Prevention Coatings and Methods," and/or U.S. patent application Ser. No. 11/959,225 filed on Dec. 18, 2007 and entitled "Adhesive Applications Using Alkali Silicate Glass for Electronics," each of which is herein incorporated by reference in its entirety.

Where an electrically conductive contact to the liquid metal is required, such as at the electrodes within the magnetic pump portion of the system, an electrically conductive coating may be used, which consists of nickel, tantalum, or tungsten metal. Similarly, solid Nickel, Tungsten, or Tantalum wires may be used for the electrodes.

Figure 4:
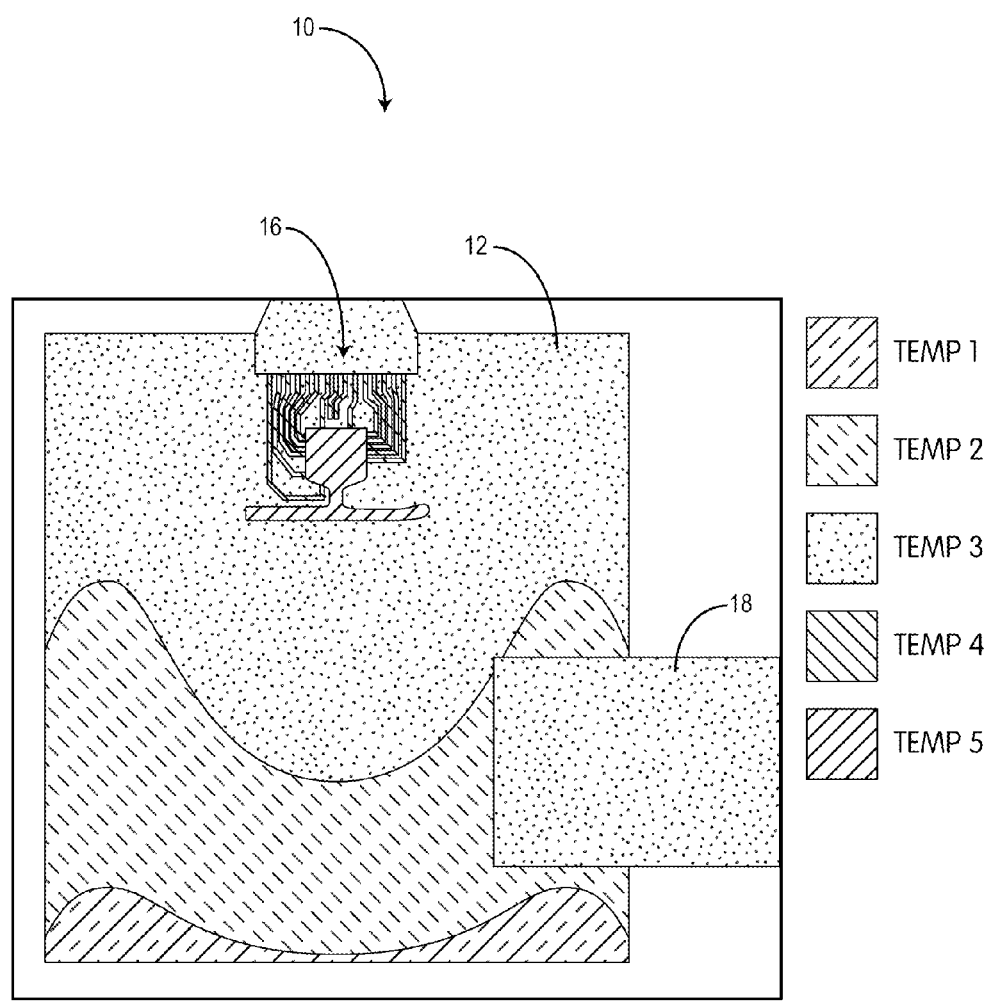
FIG. 4 is a thermal imaging schematic view of thermal management system of FIG. 1 with the pump turned off according to an exemplary embodiment.

Referring to FIG. 4 and by way of comparison with FIG. 2, the temperature of substrate 12 and device 16 are significantly higher when pump 18 is turned off in thermal management system 10, according to one exemplary embodiment. Only the small portion of substrate 12 is at the first or lowest temperature with a larger portion of substrate 12 at the second temperature and a substantial portion of substrate 12 at the third temperature. Device 16 operates at the fourth and fifth temperatures when pump 18 is not pumping liquid metal, which could affect performance and/or reliability.

Figure 5:
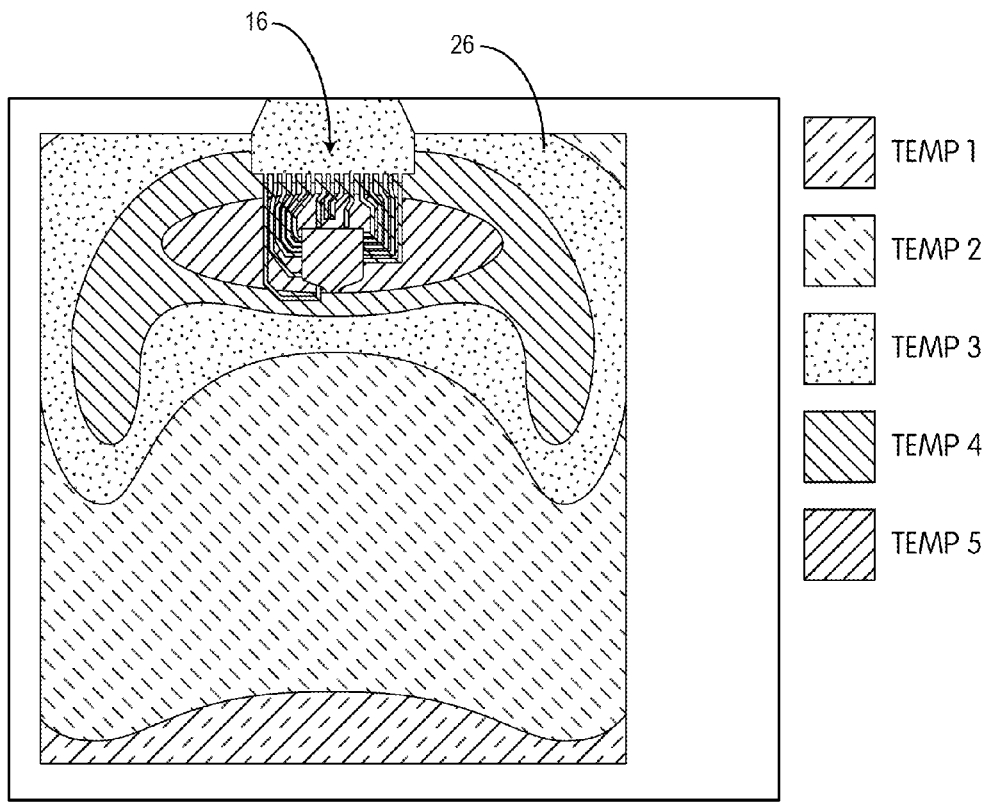
FIG. 5 is a thermal imaging schematic view of a thermal management system including a copper insert according to an exemplary embodiment.

Referring also to FIG. 5, according to one exemplary embodiment, the temperature of device 16 is greatly reduced with the sealed liquid metal cooling channel in thermal management system 10 as compared to a pure copper heat sink 26 of the same dimension. The temperature of device 16 may rise about eighty degrees C. over the cold copper plate 26 temperature and may rise only about 18.5 degrees Celsius over the cold plate temperature on the liquid metal substrate of FIG. 1. In the liquid metal substrate 12, device 16 may contribute to the majority of the thermal resistance. The temperature difference across liquid metal channel 14 may be about 1.6 degrees C. as compared to about seventy degrees C. on copper plate 26. This difference represents a nearly fourty-four times improvement in effective thermal conductivity over a copper heat sink. With smaller channel 14 dimensions and/or longer channel 14 length, the thermal conductivity may be greater.

Referring to FIGS. 6 and 7, cross-sections of the thermal management system of FIG. 1 illustrate multiple layers of system 10 according to some exemplary embodiments. Substrate 12 may include a base layer 26 that defines channel 14 and a top layer 28 that covers channel 14. Circuitry 13, device 16, and heat sink 17 are attached to top layer 28.

According to various exemplary embodiments, channel 14 can be formed by etching substrate 12 (e.g., wet etching, plasma etching, silk screen printing, photoengraving, PCB milling, die cutting, stamping, etc.) during fabrication. Substrate 12 may include any material used to make circuit boards or heat sinks including copper, another conductive material, or any non-conductive material. In one example, substrate 12 can include thermally conductive inserts or other devices for increased heat dissipation.

For example, the etching may etch away a base layer 26 of copper (or other layer) on top of a non-conductive layer to form channel 14. Alternatively, the etching may etch away a base layer 26 of non-conductive material (or both a layer of copper and a non-conductive layer) to form channel 14. Channel 14 may then be coated and/or sealed with a thermally conductive coating. Thereafter, another conductive (e.g., a heat sink) or non-conductive layer (e.g., layer 28) may be placed on top of the etched layer(s) 26. Alternatively, the etched layer(s) 26 may be placed on top of another layer or between two other layers. The non-etched layers may also include a coating to facilitate greater thermal conductivity and/or sealing with channel 14. The coating can be applied to channel 14 and/or top or bottom layers 28 and 26 during etching or after etching and before assembly. The coating can also be applied after partial assembly (e.g., after an etched layer is placed on a base layer) and before any additional layers are added.

According to various exemplary embodiments, the width of channel 14 may be between 5 and 50 mm. According to various exemplary embodiments, the height of channel 14 can be as small as 10 microns and as large 2000 microns. According to various exemplary embodiments, the length of channel 14 may be between typically 5 and 200 cm. The values of these dimensions, especially the maximum values, may be primarily dictated by geometric requirements of the system that is being thermally managed with the liquid metal cooling channel rather than limitations of the liquid metal cooling approach itself.

According to various exemplary embodiments, the general cross-sectional shape of channel 14 may be square, rectangular, triangular, hexagonal, trapezoidal, or any other shape. While channel 14 is shown to have a specific rectangular-shaped flow path, according to other exemplary embodiments, the path may be of any shape or direction that facilitates the cooling of device 16.

According to some exemplary embodiments, the liquid metal may be added to channel 14 during fabrication before a coating seals channel 14 or before a layer is placed on top of the etched layer. According to other exemplary embodiments, a reservoir may feed liquid metal to channel 14. The reservoir may be etched or otherwise formed into substrate 12. Alternatively, the reservoir may be external to substrate 12 (e.g., attached to substrate 12) and coupled to channel 14. Substrate 12 may include one or more heat sinks and/or fans at or near an end of substrate 12 opposite from the heat source (device 16) to help cool the liquid metal flowing from device 16. Alternatively or additionally, an external reservoir may include one or more heat sinks and/or fans at or near an end of substrate 12 opposite from the heat source (device 16) to help cool the liquid metal flowing from device 16.

Thermal management system 10 may provide a low cost, simple, reliable, and/or integrated method for spreading heat away from a high power devices. Integrating such a technology into an electronic substrate may allow direct heat removal from high power integrated circuits (IC) and passive devices while also providing electrical interconnect to these components. While this approach could be used for almost any type of electronics packaging, specific examples of suitable applications include RF Power Amplifiers and Light Emitting Diode (LED) light arrays, which may otherwise require that a heat sink or heat spreader be bonded to the back side of the electronic substrate so that both sides of the circuit card may be populated with electronic components. According to another exemplary application would be the use of an electronic substrate with embedded liquid metal cooling channels as part of an antenna array, such as a phased array antenna.

While the detailed drawings, specific examples, detailed algorithms and particular configurations given describe preferred and exemplary embodiments, they serve the purpose of illustration only. The embodiments disclosed are not limited to the specific forms shown. For example, the methods may be performed in any of a variety of sequence of steps or according to any of a variety of mathematical formulas. The hardware and software configurations shown and described may differ depending on the chosen performance characteristics and physical characteristics of the weather radar and processing devices. For example, the type of system components and their interconnections may differ. The systems and methods depicted and described are not limited to the precise details and conditions disclosed. The flow charts show preferred exemplary operations only. The specific data types and operations are shown in a non-limiting fashion. Furthermore, other substitutions, modifications, changes, and omissions may be made in the design, operating conditions, and arrangement of the exemplary embodiments without departing from the scope of the application as expressed in the appended claims.

What is claimed is:

1. A circuit board, comprising: a pump; a flexible substrate comprising: a base; a top coupled to the base; a channel formed by the base and a first side of the top; a liquid metal provided in the channel; and a coating provided on at least a portion of the channel; and a heat sink and circuitry both directly coupled to a second side of the top opposite the first side of the top; wherein the liquid metal is pumped through the channel by the pump and the coating reduces diffusion between the liquid metal and portions of the channel; wherein the pump is configured to vary the flow rate of the liquid metal through the pump based on current received from an adjustable current supply circuit; and wherein the channel is formed of substantially thermally non-conductive material to form a substantially non-thermally conductive channel such that the liquid metal receives heat from a heat producing device and carries the heat through the substantially non-thermally conductive channel to the heat sink.

2. The circuit board of claim 1, the pump being an electromagnetic pump and comprising one or more electrodes and one or more magnets, wherein the liquid metal is pumped through the channel by a force generated by the one or more electrodes and one or more magnets.

3. The circuit board of claim 1, wherein the liquid metal comprises gallium, indium, tin, bismuth, lead, sodium, and/or potassium as constituents.

4. The circuit board of claim 1, further comprising at least one electrical interconnect allowing at least one electrical component to populate the circuit board and form an electronics assembly.

5. The circuit board of claim 1, wherein the coating passivates the liquid metal from metallic components within the channel to reduce diffusion and chemical reaction between the liquid metal and the metallic components.

6. The circuit board of claim 1, wherein the coating is a hermetic or near hermetic coating.

7. The circuit board of claim 1, wherein the coating is a thermally conductive coating.

8. The circuit board of claim 1, further comprising: wherein the circuitry is provided on the substrate at a first location and wherein the heat sink is provided on the substrate at a second location of the substrate spaced apart from the first location.

9. A circuit board comprising: one or more electrodes; one or more magnets; a substrate comprising: a top layer; a bottom layer; a channel integrated into the substrate and formed on one side by the top layer and on three sides by the bottom layer, wherein the channel is formed of substantially thermally non-conductive material to form a substantially non-thermally conductive channel; a liquid metal provided within the channel; and a coating provided on at least a portion of the channel; a heat sink and circuitry both directly provided on the top layer opposite the channel; and at least one circuitry component provided on the substrate at a location spaced apart on the substrate from the heat sink; wherein the liquid metal is pumped through the channel by a force generated by the one or more electrodes and one or more magnets and the coating reduces diffusion or alloying between the liquid metal and metallic components in the channel; wherein the one or more electrodes and one or more magnets are configured to vary the flow rate of the liquid metal based on current received from an adjustable current supply circuit; and wherein the liquid metal within the channel receives heat from the at least one circuitry component and carries the heat through the substantially non-thermally conductive channel to the heat sink.

10. The circuit board of claim 9, wherein the at least one magnet is an electromagnet.

11. The circuit board of claim 9, wherein the at least one magnet is a permanent magnet.

12. The circuit board of claim 9, wherein the liquid metal is a eutectic gallium-indium-tin alloy.

13. The circuit board of claim 9, wherein the coating is a thermally conductive coating.

14. A circuit board comprising: a flexible substrate comprising substantially thermally non-conductive channel means for containing a liquid metal and a top; pump means for pumping the liquid metal through the channel means; coating means for reducing diffusion and chemical reaction between the liquid metal and other components in the channel; and at least one circuitry component directly coupled to the top of the substrate at a first location; and a heat sink directly coupled to the top of the substrate at a second location spaced apart from the first location; wherein the pump means is configured to vary the flow rate of the liquid metal based on current received from an adjustable current supply circuit; and wherein the liquid metal within the channel means receives heat from the at least one circuitry component and carries the heat through the substantially non-thermally conductive channel to the heat sink.

15. The circuit board of claim 14, wherein the liquid metal comprises gallium, indium, tin, bismuth, lead, sodium, and/or potassium as constituents.

16. The circuit board of claim 15, further comprising at least one electrical interconnect allowing the at least one circuitry component to populate the substrate and form an electronics assembly.

17. The circuit board of claim 14, wherein the coating means passivates the liquid metal from metallic components within the channel to reduce diffusion between the liquid metal and the metallic components.

18. The circuit board of claim 14, wherein the coating is a hermetic or near-hermetic coating.

* * * * *